(12) United States Patent
Gamini et al.

(10) Patent No.: US 8,076,759 B2
(45) Date of Patent: *Dec. 13, 2011

(54) SEMICONDUCTOR PACKAGE WITH A CONTROLLED IMPEDANCE BUS AND METHOD OF FORMING SAME

(75) Inventors: Nader Gamini, San Jose, CA (US); Donald V. Perino, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 79 days.

This patent is subject to a terminal disclaimer.

(21) Appl. No.: 12/627,885

(22) Filed: Nov. 30, 2009

(65) Prior Publication Data

US 2010/0072605 A1    Mar. 25, 2010

Related U.S. Application Data

(63) Continuation of application No. 11/354,765, filed on Feb. 14, 2006, now Pat. No. 7,626,248.

(51) Int. Cl.
*H01L 39/00* (2006.01)
(52) U.S. Cl. ....................................................... 257/663
(58) Field of Classification Search ................... 257/663
See application file for complete search history.

(56) References Cited

U.S. PATENT DOCUMENTS

| | | | |
|---|---|---|---|
| 4,636,982 A | 1/1987 | Takemae et al. | 365/149 |
| 4,766,538 A | 8/1988 | Miyoshi | 364/200 |
| 4,985,867 A | 1/1991 | Ishii et al. | 365/221 |
| 5,222,047 A | 6/1993 | Matsuda et al. | 365/230.03 |
| 5,307,469 A | 4/1994 | Mann | 395/425 |
| 5,334,962 A | 8/1994 | Higgins et al. | 333/247 |
| 5,394,528 A | 2/1995 | Kobayashi et al. | 395/325 |
| 5,530,814 A | 6/1996 | Wong et al. | 395/312 |
| 5,559,970 A | 9/1996 | Sharma | 395/312 |
| 5,614,855 A | 3/1997 | Lee et al. | 327/158 |
| 5,630,106 A | 5/1997 | Ishibashi | 345/521 |
| 5,652,870 A | 7/1997 | Yamasaki et al. | 395/500 |
| 5,655,113 A | 8/1997 | Leung et al. | 395/552 |
| 5,717,871 A | 2/1998 | Hsieh et al. | 395/250 |
| 5,717,901 A | 2/1998 | Sung et al. | 395/497.01 |
| 5,764,590 A | 6/1998 | Iwamoto et al. | 365/233 |
| 5,787,267 A | 7/1998 | Leung et al. | 395/482 |
| 5,793,998 A | 8/1998 | Copeland et al. | 395/201 |
| 5,798,998 A | 8/1998 | Fukushima et al. | 369/30.9 |

(Continued)

FOREIGN PATENT DOCUMENTS

EP         887737 A2    12/1998

(Continued)

OTHER PUBLICATIONS

Kirihata, T., et al., "A 390-mm2, 16-Bank, 1-Gb DDR SDRAM with Hybrid Bitline Architecture," IEEE Journal of Solid-State Circuits, vol. 34, No. 11, Nov. 1999, pp. 1580-1588.

(Continued)

*Primary Examiner* — Samuel Gebremariam
(74) *Attorney, Agent, or Firm* — Morgan, Lewis & Bockius LLP

(57) ABSTRACT

An apparatus includes a first substrate having a set of semiconductor devices formed within it. The apparatus also includes a second substrate. A third substrate has a data conductor coupled between first and second connections to the second substrate. The data conductor is coupled to the set of semiconductor devices at respective connection points.

20 Claims, 19 Drawing Sheets

U.S. PATENT DOCUMENTS

| | | | | |
|---|---|---|---|---|
| 5,801,985 A | 9/1998 | Roohparvar et al. | ..... | 365/185.01 |
| 5,808,947 A | 9/1998 | McClure | ........................ | 365/201 |
| 5,831,925 A | 11/1998 | Brown et al. | ............ | 365/230.03 |
| 5,852,725 A | 12/1998 | Yen | ................................ | 395/282 |
| 5,893,927 A | 4/1999 | Hovis | ............................. | 711/171 |
| 5,897,193 A | 4/1999 | Nishino | ........................ | 257/691 |
| 5,933,387 A | 8/1999 | Worley | .................... | 365/230.03 |
| 5,958,033 A | 9/1999 | Schubert et al. | ............. | 710/126 |
| 5,995,379 A | 11/1999 | Kyougoku et al. | ........... | 361/803 |
| 6,034,878 A | 3/2000 | Osaka et al. | ...................... | 365/52 |
| 6,038,132 A | 3/2000 | Tokunaga et al. | ............. | 361/760 |
| 6,047,347 A | 4/2000 | Hansen et al. | ................. | 710/127 |
| 6,064,585 A | 5/2000 | Mori et al. | ........................ | 365/63 |
| 6,125,157 A | 9/2000 | Donnelly et al. | ............. | 375/371 |
| 6,138,185 A | 10/2000 | Nelson et al. | .................... | 710/33 |
| 6,141,273 A | 10/2000 | Ku et al. | ......................... | 365/201 |
| 6,144,220 A | 11/2000 | Young | ............................. | 326/41 |
| 6,144,576 A | 11/2000 | Leddige et al. | ................. | 365/63 |
| 6,175,124 B1 | 1/2001 | Cole et al. | ........................ | 257/48 |
| 6,188,595 B1 | 2/2001 | Chevallier | ........................ | 365/51 |
| 6,191,998 B1 | 2/2001 | Reddy et al. | ............. | 365/230.05 |
| 6,214,645 B1 | 4/2001 | Kim | ................................ | 438/110 |
| 6,219,785 B1 | 4/2001 | Smith | ................................ | 713/1 |
| 6,240,039 B1 | 5/2001 | Lee et al. | ................. | 365/230.06 |
| RE37,409 E | 10/2001 | Barth et al. | ............... | 365/230.03 |
| 6,307,256 B1 | 10/2001 | Chiang et al. | .................... | 257/668 |
| 6,307,769 B1 | 10/2001 | Nuxoll et al. | ..................... | 365/63 |
| 6,311,313 B1 | 10/2001 | Camporese et al. | .............. | 716/6 |
| 6,404,660 B1 | 6/2002 | Gamini et al. | ................... | 365/51 |
| 6,496,400 B2 | 12/2002 | Chevallier | ........................ | 365/51 |
| 6,594,818 B2 | 7/2003 | Kim et al. | ........................ | 716/19 |
| 6,889,304 B2 | 5/2005 | Perego et al. | .................. | 711/170 |
| 7,626,248 B2 * | 12/2009 | Gamini et al. | ................. | 257/663 |
| 2001/0016369 A1 | 8/2001 | Zandman et al. | ............. | 438/106 |
| 2004/0019756 A1 | 1/2004 | Perego et al. | .................. | 711/170 |
| 2004/0221106 A1 | 11/2004 | Perego et al. | .................. | 711/115 |

FOREIGN PATENT DOCUMENTS

WO      WO 91/16680 A1    10/1991

OTHER PUBLICATIONS

John, L.K., "VaWiRAM: A Variable Width Random Access Memory Module," 1995 IEEE, 9th International Conference on VLSI Design—1996. pp. 219-224.

Satoh, K. et al., "A 209K-Transistor ECL Gate Array with RAM," IEEE Journal of Solid-State Circuits, vol. 24, No. 5, Oct. 1989, pp. 1275-1281.

Masumoto, R.T., "Configurable On-Chip RAM Incorporated Into High Speed Logic Array," Proceedings of the IEEE 1985 Custom Integrated Circuits Conference, May 20-23, 1985, pp. 240-243.

Rynearson, J., "VMEbus Daisy Chains," Reprinted from the VITA Journal. Originally writtten in Mar. 1997, last pg. of article updated Sep. 15, 1999, 2 pgs.

Minutes of Meeting No. 70, JC-42.3 Committee on RAM Memories, Mar. 9, 1994, Orlando, Florida, 72 pages (see, in particular, p. 62).

Microsoft Computer Dictionary, Copyright 1999, Fourth Edition, p. 145.

* cited by examiner

SEMICONDUCTOR PACKAGE WITH A CONTROLLED IMPEDANCE BUS AND METHOD OF FORMING SAME

CROSS REFERENCE TO RELATED APPLICATIONS

The present patent application is a continuation of, and claims priority to, U.S. patent application Ser. No. 11/354,765, filed Feb. 14, 2006, now U.S. Pat. No. 7,626,248 which claims priority to, U.S. patent application Ser. No. 10/749,214, filed Dec. 30, 2003, which is now U.S. Pat. No. 6,999,332; which is a continuation of U.S. patent application Ser. No. 10/410,390, filed Apr. 8, 2003, which is now U.S. Pat. No. 6,714,431; which is a continuation of U.S. patent application Ser. No. 10/045,864, filed Jan. 9, 2002, which is now U.S. Pat. No. 6,583,035; which is a divisional of U.S. patent application Ser. No. 09/471,305, filed Dec. 23, 1999, which is now U.S. Pat. No. 6,404,660, all of which are incorporated herein by reference.

BRIEF DESCRIPTION OF THE INVENTION

This invention relates generally to the physical layout of semiconductor systems. More particularly, this invention relates to a high density planar semiconductor system with a controlled impedance co-planar interconnect channel.

BACKGROUND OF THE INVENTION

Semiconductor systems are implemented in a variety of configurations. One type of semiconductor system is a master-slave system in which a semiconductor-based master device controls a set of semiconductor-based slave devices. An example of a master-slave system is a memory system in which a master device memory controller coordinates the operation of a set of slave devices in the form of memory modules. By way of example, the invention is described in the context of a memory system, although the invention is equally applicable to other types of semiconductor systems.

As computer processors increase in speed, there is a growing burden being placed upon memory systems that provide data to computer processors. For example, video and three-dimensional image processing places a large burden on a computer memory subsystem.

One or more high frequency buses are typically employed to provide the required bandwidth in such systems. The higher the frequency of operation of the bus, the greater the requirement that the signals on the bus have high-fidelity and equal propagation times to the devices making up the subsystem. High-fidelity signals are signals having little or no ringing, and which have controlled and steady rising and falling edge rates.

Many obstacles are encountered in assuring the uniform arrival times of high-fidelity signals to devices on the bus. One issue is whether the bus is routed in a straight line or routed with turns. Turns of the lines may not permit the construction of the bus lines in a way necessary to achieve uniform arrival times of high-fidelity signals to devices on the bus.

The assignee of the present invention has filed a patent application entitled "High Frequency Bus System," Ser. No. 08/938,084, filed Sep. 26, 1997, the contents of which are expressly incorporated herein. The foregoing patent application discloses a digital system 20 of the type shown in FIG. 1. The system 20 includes a mother board 22, which supports a master device 24 and a set of slave modules 26A, 26B, and 26C. A bus 28 is routed in a horizontal and vertical manner to interconnect the master device 24 with the set of slave modules 26A, 26B, and 26C, as shown in FIG. 1. The bus 28 is terminated in a resistor 30.

FIG. 2 is a side view of one of the modules 26 of FIG. 1. Module 26 has a set of slave devices 32A-32E mounted thereon. The slave devices 32 may be mounted on one side or both sides of the module. The module also includes a set of edge fingers 34 for coupling to the bus 28.

FIG. 3 is a top view of one of the modules 26 of FIG. 1. Module 26 has a set of slave devices 32A-32E mounted on it. Module leads 36 link the set of slave devices 32A-32E and thereby form a portion of the bus 28. Each slave device of FIG. 3 is enclosed in it's own package 33A-33E.

The structure of FIGS. 1-3 represents state-of-the-art packaging for master-slave systems, such as memory subsystems, which are operated with a memory controller (master) and a set of random access memories (slaves). Each slave device of FIG. 2 is enclosed in its own package. Metal traces or module leads 36 are used between the packages.

Placing each slave device in its own package is relatively expensive. Furthermore, such an approach is relatively space-intensive. In addition, such an approach can result in substantive signal propagation delays between, for example, the first and last slave devices in a row of slave devices.

It would be highly desirable to improve the performance of semiconductor systems, such as master-slave systems in the form of memory systems. Such improvements could be exploited to support the increased information bandwidth of modern computers.

SUMMARY OF THE INVENTION

One embodiment of the invention defines an apparatus. The apparatus includes a first substrate having a set of semiconductor devices formed within it. The apparatus also includes a second substrate. A third substrate has a data conductor coupled between first and second connections to the second substrate. The data conductor is coupled to the set of semiconductor devices at respective connection points.

Another embodiment of the invention is a semiconductor system with an interconnect channel with an input end to receive a set of input signals and an output end to route a set of output signals. A set of semiconductor devices are formed in a substrate, with each semiconductor device of the set of semiconductor devices being designed for independent operability and being electrically isolated within the substrate from adjacent semiconductor devices of the set of semiconductor devices. Each semiconductor device includes a set of input nodes and a set of output nodes formed on the surface of the substrate. The interconnect channel is positioned on the input nodes and the output nodes of each semiconductor device of the set of semiconductor devices. The set of input signals from the input end of the interconnect channel is applied to each semiconductor device of the set of semiconductor devices to produce the output signals at the output end of the interconnect channel.

The method of the invention includes the step of forming a set of semiconductor devices in a wafer. Each semiconductor device of the set of semiconductor devices is designed for independent operability and is electrically isolated within the substrate from adjacent semiconductor devices of the set of semiconductor devices. The forming step also includes the step of forming within each semiconductor device, a set of input nodes and a set of output nodes on the surface of the substrate. Faulty semiconductor devices and operable semiconductor devices are then identified within the set of semiconductor devices. A set of operable semiconductor devices that are adjacent to one another on the wafer are subsequently grouped. An interconnect channel is then applied to the set of operable semiconductor devices so as to electrically link input nodes and output nodes of each semiconductor device within the set of operable semiconductor devices.

The interconnect channel may be a set of metal traces positioned over the set of memory devices. Alternately, the interconnect channel may be formed on an interconnect substrate, such as a thin-film substrate, flexible tape, or a printed circuit board. The set of memory devices and the interconnect channel may be positioned in a single package.

The invention improves performance in semiconductor systems, such as master-slave memory systems. The improved performance increases information bandwidth of computer and computer subsystems. The invention produces high density systems with reduced signal propagation times. The high density systems of the invention reduce packaging costs and improve thermal performance.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 4:
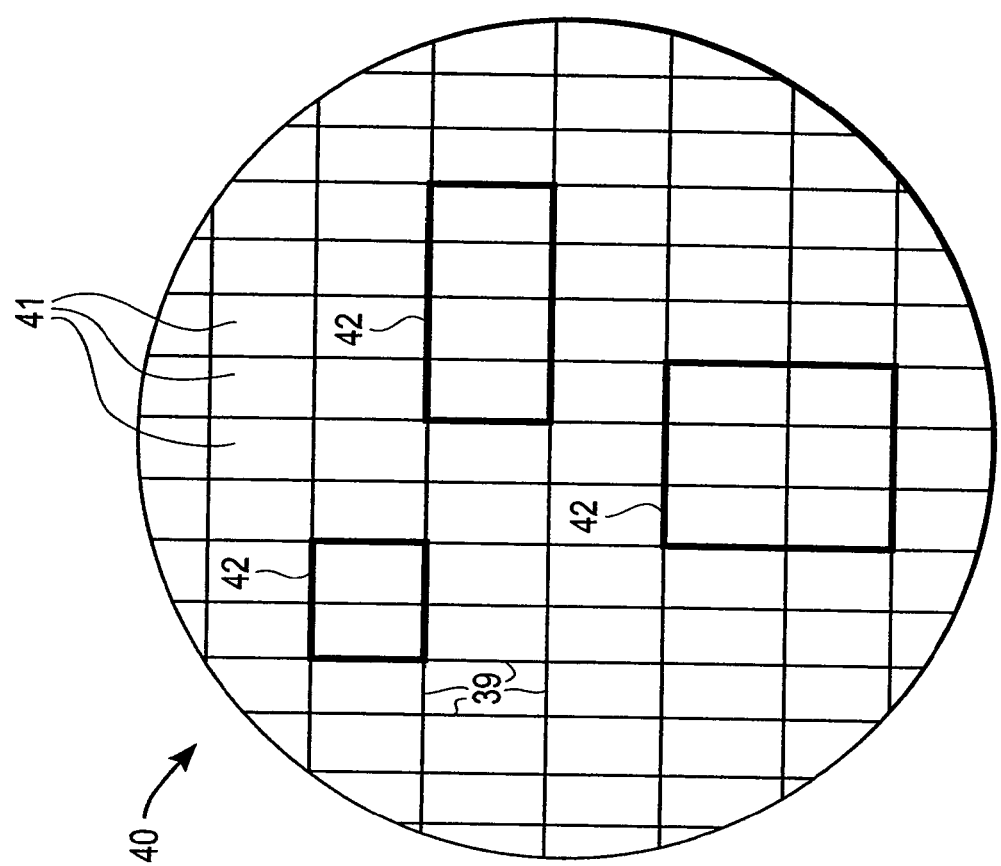
FIG. 4 illustrates a wafer with different sets of slave devices that may be packaged in accordance with the invention.

FIG. 4 illustrates a wafer 40 used to fabricate a set of semiconductor devices 41. Each semiconductor device 41 is designed for independent operability and is electrically isolated within the wafer 40 from adjacent semiconductor devices 41. Thus, as used herein, the term "semiconductor device" or "integrated circuit" or "die" refers to a circuit with active components and connecting wires formed in a semiconductor material, which also forms a perimeter border without active components or connecting wires. The perimeter border without active components or connecting wires associated with each semiconductor device is referred to as a "scribe lane." Typically, a semiconductor device is cut along a set of scribe lines within a corresponding set of scribe lanes to separate the semiconductor device from the other semiconductor devices of a wafer. FIG. 4 illustrates scribe lanes 39 surrounding each semiconductor device 41.

By way of example, each semiconductor device 41 may be a slave device, which may be a memory device, such as a DRAM or a SRAM. In the prior art, the wafer 40 is cut such that each slave device 41 is packaged separately. In accordance with the invention, groups 42 of slave devices 41 are positioned in a single package. As discussed below, the groups 42 of slave devices 41 are linked by an interconnect channel positioned on top of the slave devices. This configuration produces a high density semiconductor system with reduced signal propagation times. Furthermore, the configuration reduces packaging costs and improves thermal performance.

Figure 5:
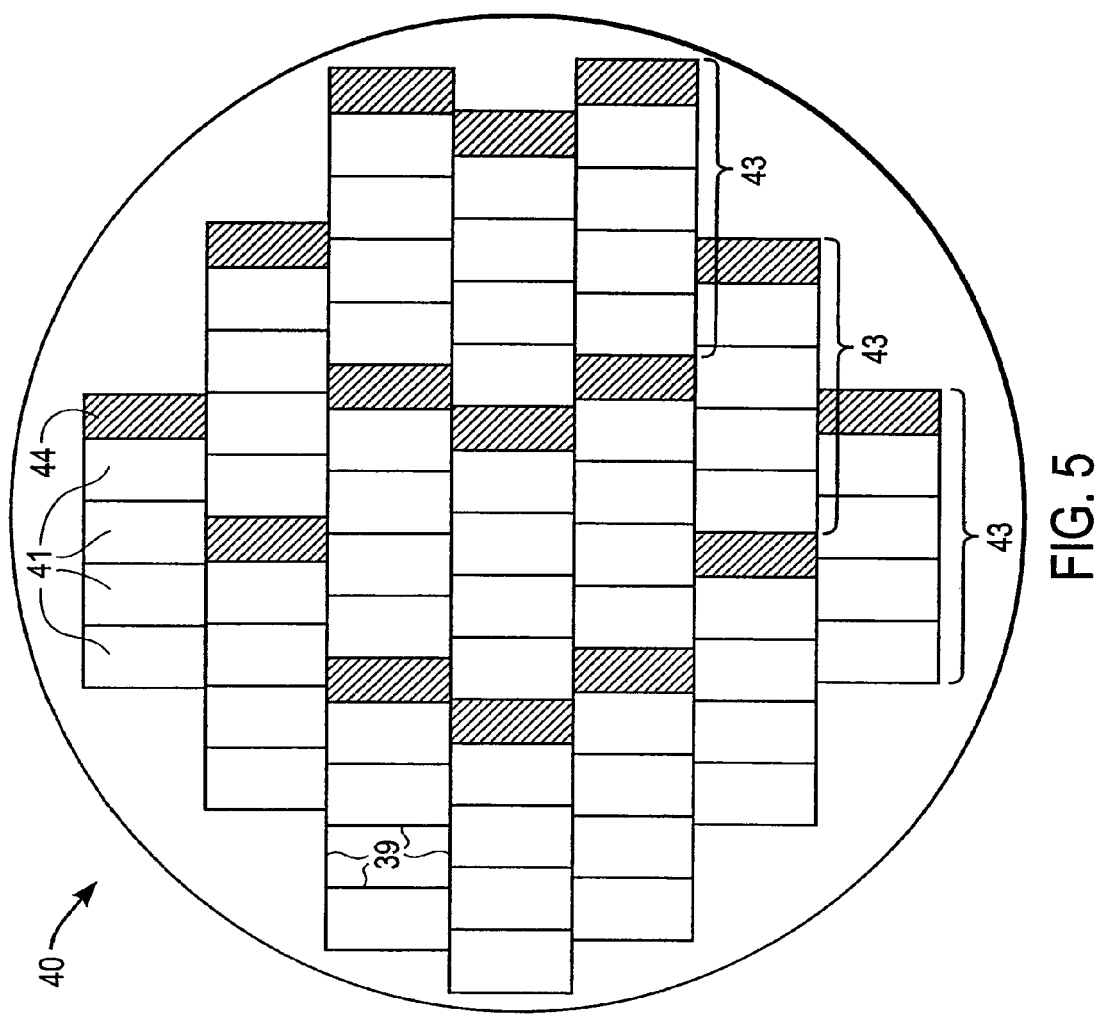
FIG. 5 illustrates a wafer with uniform sets of slave devices that may be packaged in accordance with the invention.

FIG. 4 illustrates groups 42 of varying size. FIG. 5 illustrates a wafer with groups 43 of slave devices of a uniform size, each including four slave devices 41 and a signal repeater 44. Observe that each slave device 41 and signal repeater 44 is surrounded by a set of scribe lanes 39.

Figure 6A:
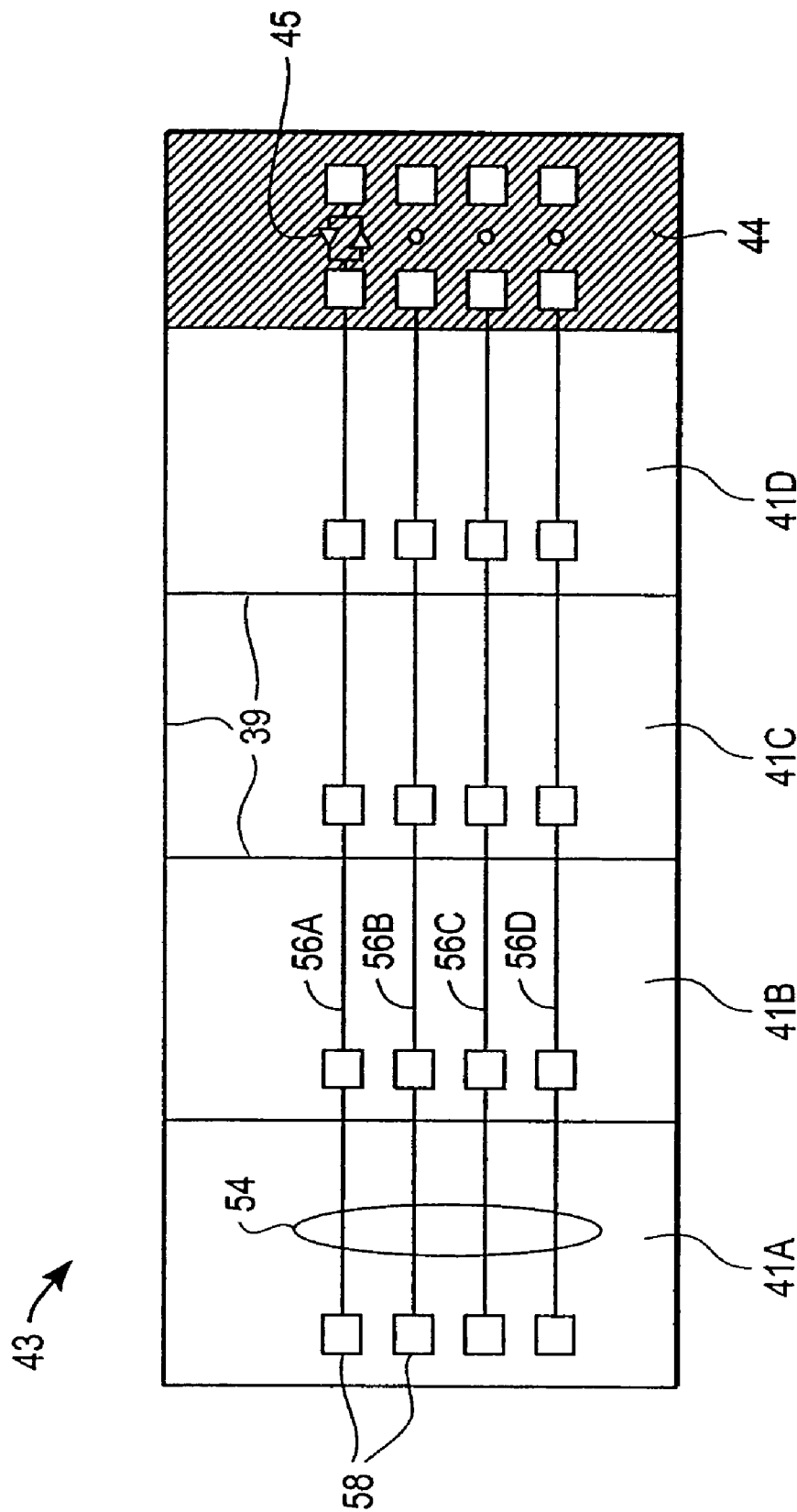
FIGS. 6A and 6B illustrate high density planar semiconductor systems with co-planar interconnect channels in the form of metal traces in accordance with embodiments of the invention.

FIG. 6A illustrates a group 43 of slave devices 41 of the type shown in FIG. 5. The group 43 comprises a set of slave devices 41A, 41B, 41C, 41D, and a signal repeater 44. The signal repeater 44 includes a set of transceivers 45. The set of slave devices 43 may be cut from a wafer 40, as shown in FIG. 5. FIG. 6A illustrates scribe lanes 39. Observe that the far left scribe lane, far right scribe lane, and horizontal scribe lanes in the figure have been used to cut the group 43 of slave devices 41. The interior vertical scribe lanes 39 have not been used to separate adjacent devices 41, but still exist between slave devices 41.

In accordance with the invention, an interconnect channel 54 is positioned over the set of devices 41A, 41B, 41C, 41D, and 44. In this embodiment of the invention, the interconnect channel 54 is implemented as a set of metal traces 56A, 56B, etc. The metal traces 56 may be formed on the wafer during the fabrication process. Alternately, they may be formed after wafer processing by using chemical vapor deposition or other well known semiconductor processing techniques.

The metal traces 56 forming the interconnect channel 54 constitute controlled-impedance transmission lines. The interconnect channel 54 is applied to a minimum of two slave devices, but may be routed over an entire wafer. Each slave device 41 includes a set of device bond pads or vias 58. The metal traces 56 electrically connect the device bond pads or vias 58 so that signals can be routed into the devices 41.

Figure 6B:
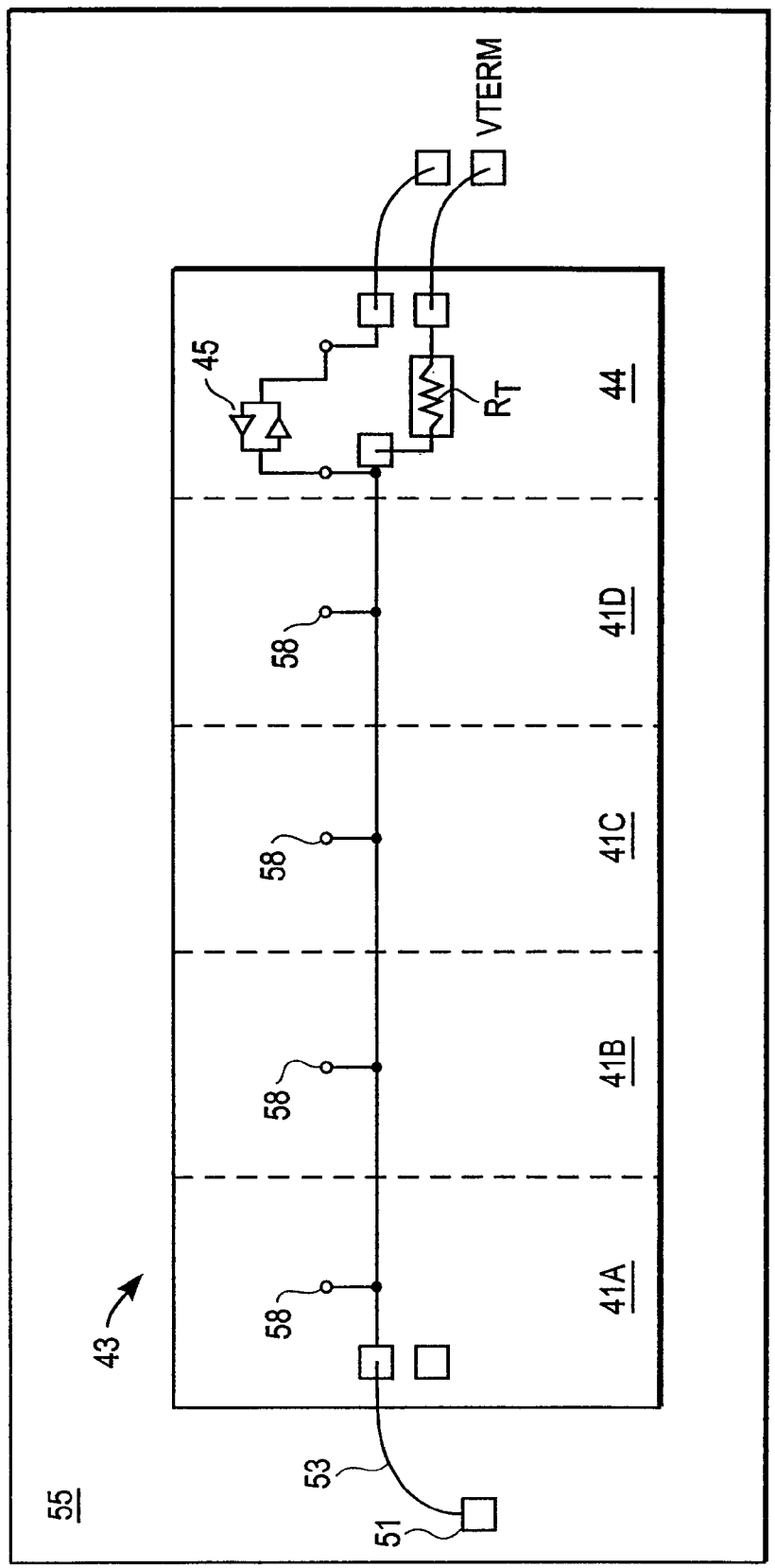

FIG. 6B also illustrates a group 43 of slave devices 41A-41D and a repeater 44. The repeater 44 includes a set of transceivers 45 and a termination resistor $R_T$. The figure also illustrates vias or bond pads 58 connecting to the individual devices 41 and 44. Perimeter bond pads 58 are used to establish an electrical connection with a substrate bond pad 51 via bond wire 53. The substrate bond pad 51 is positioned on substrate 55.

Figure 3:
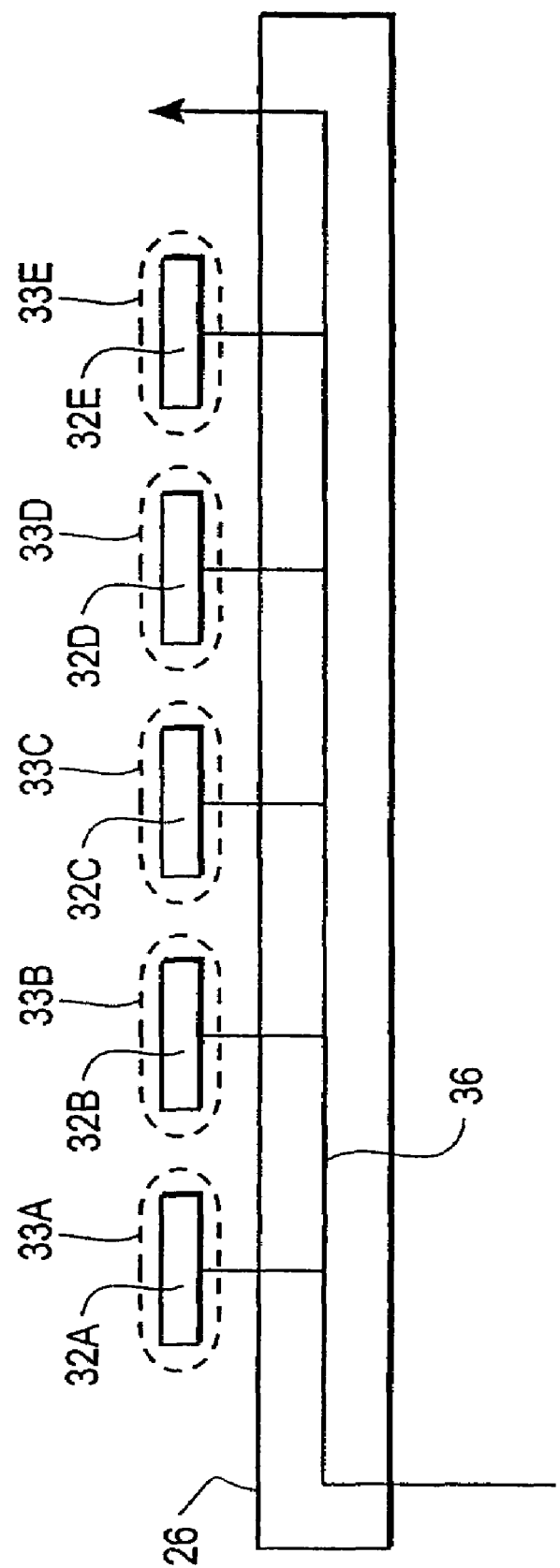
FIG. 3 illustrates a top view of a slave module from the master-slave digital system of FIG. 1.
Figure 7A:
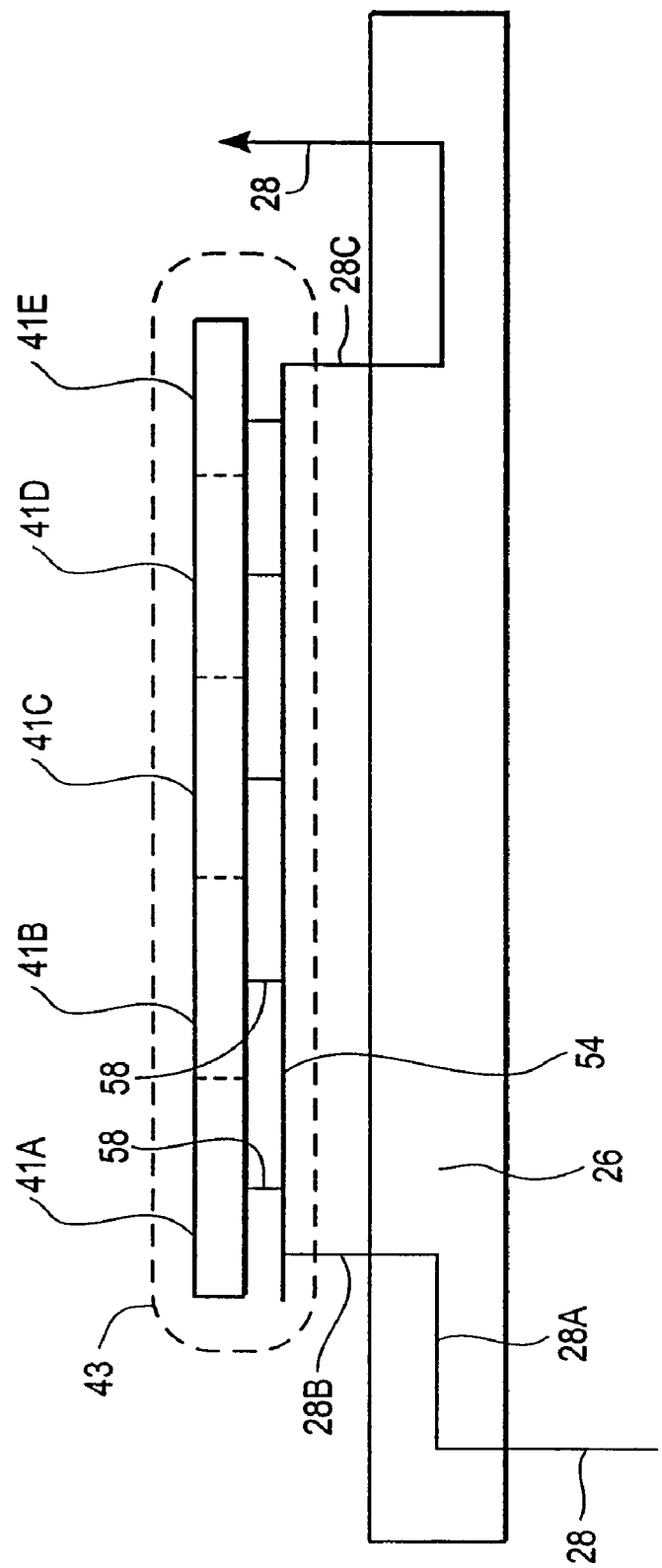
FIGS. 7A and 7B illustrate high density planar semiconductor systems of the invention incorporated into a system of the type shown in FIGS. 1-3.

FIG. 7A is a top view of a slave module 26 of the type shown in FIG. 3. However, in the embodiment of FIG. 7A, a high density group of slave 43 is mounted on the module 26. The figure shows the bus 28 connected to interconnect channel 54. The impedance of the interconnect channel 54 is configured to substantially match the impedance of the bus 28. That is, the impedance of the interconnect channel 54 matches the impedance of the bus 28 within plus or minus 30%. In one embodiment of the invention, the interconnect channel has individual metal traces, each with a controlled impedance between 20 Ohms and 100 Ohms.

Observe in FIG. 7A that the bus 28 is connected to the module 26 at a first device 41A and at the last device 41E. All other communication on the module 26 is via the interconnect channel 54. More particularly, FIG. 7A illustrates that the bus 28 is routed from a bus segment 28A into the package 43 via a bus segment 28B. Next, the bus 28 is routed with conductor 54 to sequentially coupled slave devices 41A-41E. Finally, the bus 28 is routed out of the package 43 with a bus segment 28C, after which it is routed on the motherboard 26. This forms a transmission line environment with stubs 58 having a delay shorter than the edge rate of the transmitted signals.

The configuration of FIG. 7A stands in contrast to the configuration of FIG. 3, in which each slave device is in a separate package and module leads 36 formed on the module 26 are used to establish connections between slave devices. The prior art configuration of FIG. 3 results in increased expense and prolonged propagation times compared to the system of the present invention, as shown in FIG. 7A.

Figure 7B:
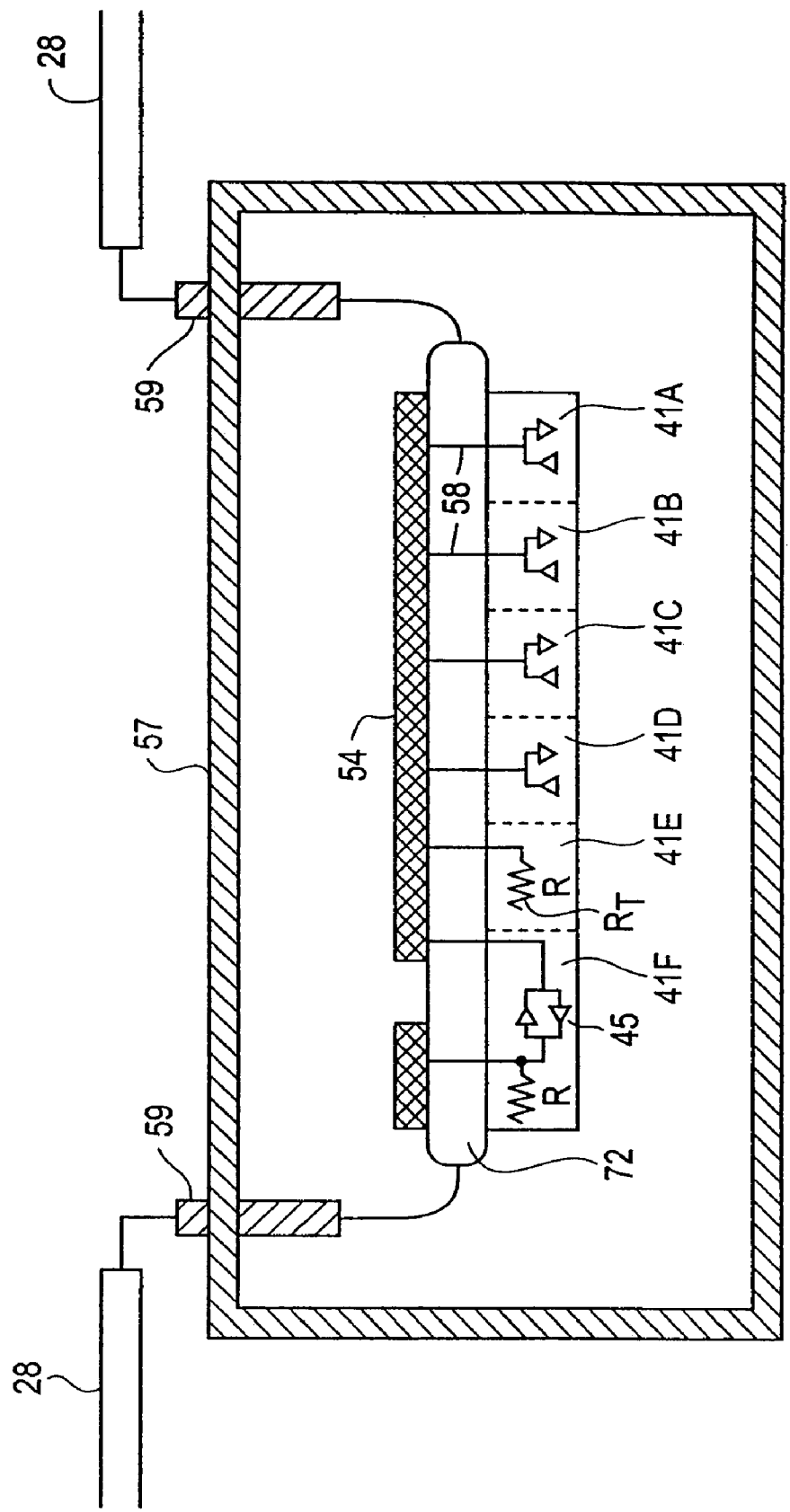

FIG. 7B illustrates the bus 28 connected to an interconnect channel 54. In particular, the bus 28 is connected to the interconnect channel 54 via leads 59 of package 57. The interconnect channel 54 includes an interconnect substrate 72 (e.g., a thin-film device, flexible tape, printed circuit board, and the like) with vias 58 extending to individual devices 41A-41F. Device 41E includes a termination resistor $R_T$, while device 41F includes a set of transceivers 45. The value of the termination resistor $R_T$ is selected such that its impedance substantially matches the impedance of the bus 28. That is, the value of the termination resistor is selected such that its impedance is within plus or minus 30% of the impedance of the bus 28.

Figure 8:
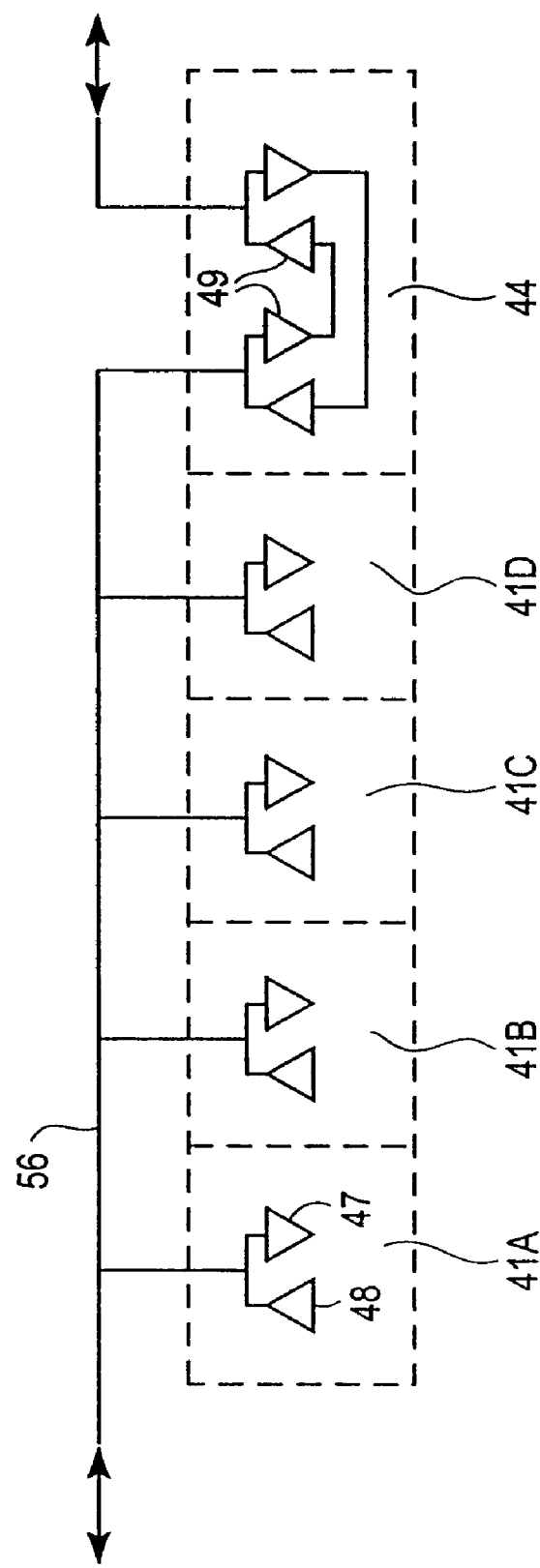
FIG. 8 illustrates buffering devices that may be used in accordance with an embodiment of the invention.

FIG. 8 illustrates signal buffers that may be used in accordance with an embodiment of the invention. In particular, the figure illustrates a metal trace 56 of the interconnect channel 54 connected to the individual slave devices 41A, 41B, 41C, and 41D. Each slave devices includes an input signal buffer 47 and an output signal buffer 48. The signal repeater 44 includes a set of repeater buffers 49 to drive incoming and outgoing signals.

Figure 9:
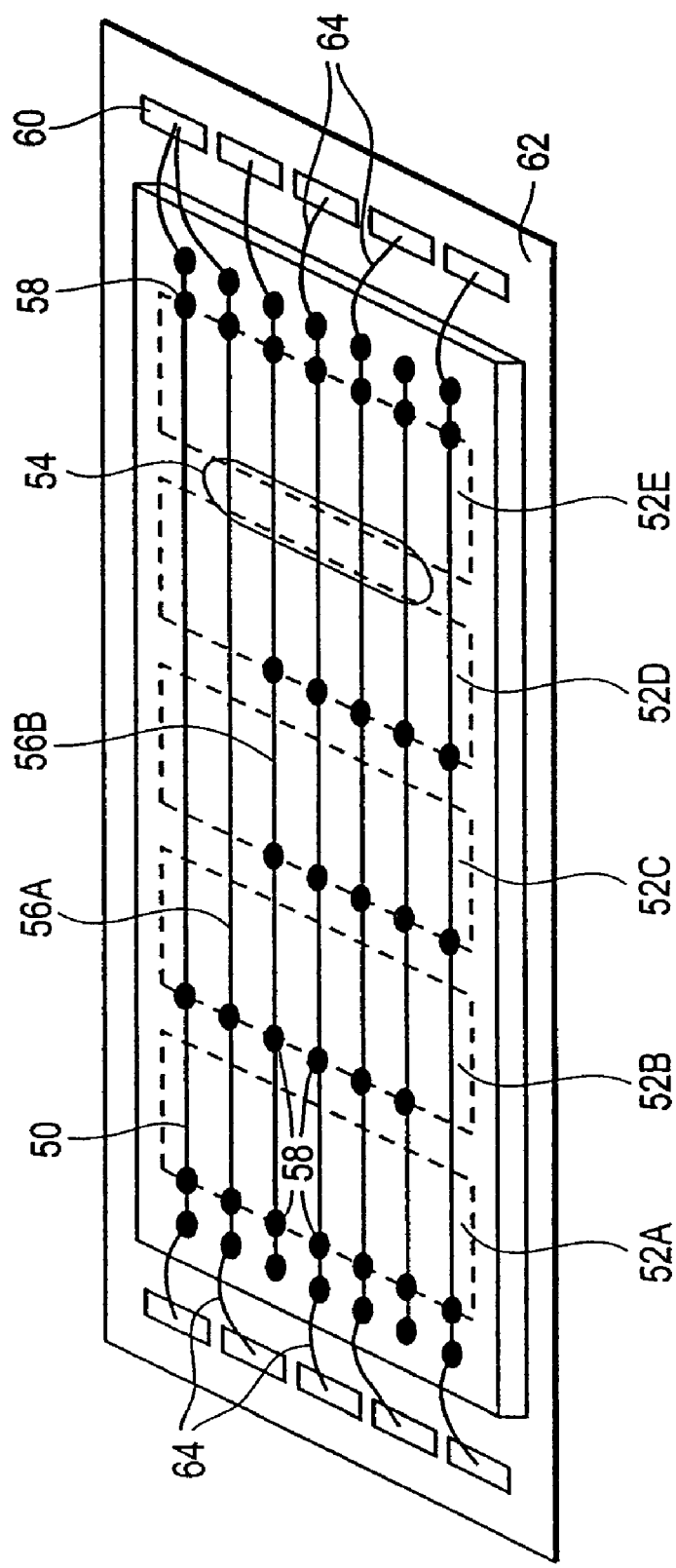
FIG. 9 illustrates a high density planar semiconductor system of the invention connected to a motherboard in accordance with an embodiment of the invention.

FIG. 9 illustrates another embodiment of the invention. FIG. 9 illustrates a set of slave devices 52A-52E. The slave devices 52A-52E are connected to the interconnect channel 54 through vias 58.

FIG. 9 also illustrates connections between the semiconductor substrate 50 that includes the slave devices 52A-52E and a motherboard 62. A set of input/output bond pads 60 are used to establish electrical links with a motherboard 62 via bondwires 64.

Figure 10:
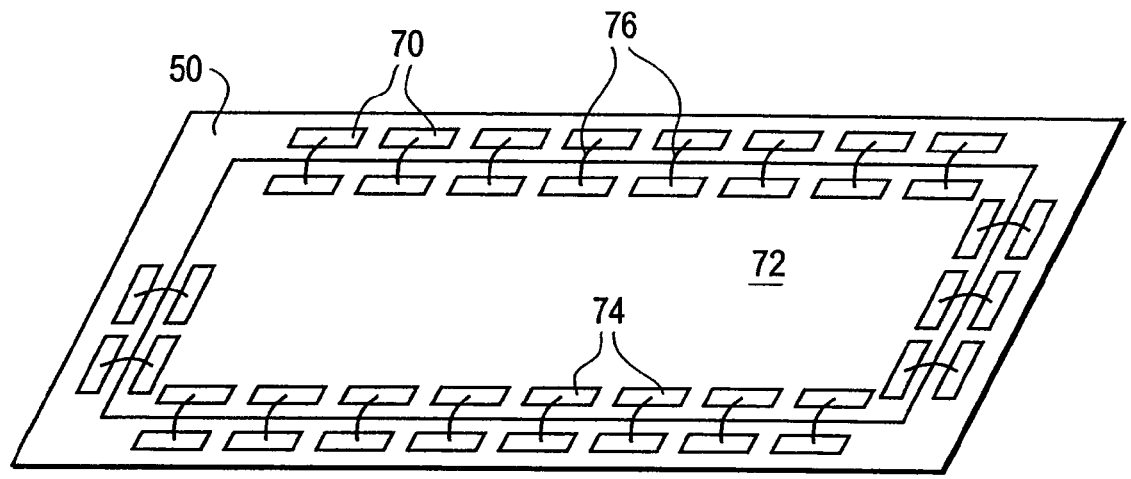
FIG. 10 illustrates a high density planar slave device system with a co-planar interconnect channel in the form of a thin-film in accordance with an embodiment of the invention.

FIG. 10 illustrates an alternate embodiment of the invention in which the interconnect structure is implemented on an interconnect substrate 72. The interconnect substrate may be a thin-film device (e.g., polyimide), a flexible tape, a printed circuit board, or similar structure. The second substrate may be formed in a separate, optimized process and then be applied to the substrate 50.

In the embodiment of FIG. 10, the slave devices have perimeter bond pads 70, while the interconnect substrate 72 has bond pads 74. Bond wires 76 are used to link the bond pads on the respective surfaces.

Figure 11:
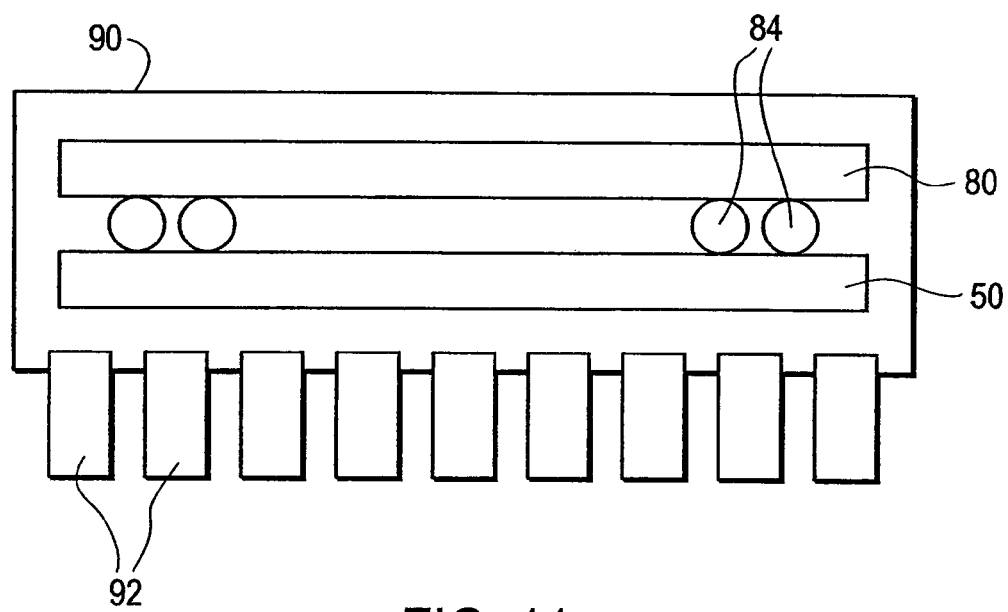
FIG. 11 illustrates a high density planar slave device system with a co-planar interconnect channel positioned in a package, in accordance with an embodiment of the invention.

FIG. 11 illustrates another embodiment of the invention. In FIG. 11, the semiconductor substrate 50 is linked, via bond balls 84, to an interconnect substrate 80 in the form of a printed circuit board. Thus, in the embodiment of FIG. 11, a flip-chip configuration is used. The advantages of a flip-chip configuration can therefore be exploited in connection with the invention. These advantages include reduced package inductance, compact packaging, and reduced manufacturing cost.

FIG. 11 further illustrates that the substrate 50 and the printed circuit board 80 are positioned within a package 90. For example, the package may be a standard plastic pin grid array (PPGA) package. External pins 92 may be electrically connected to the printed circuit board 80 using conventional internal traces (not shown).

Figure 12:
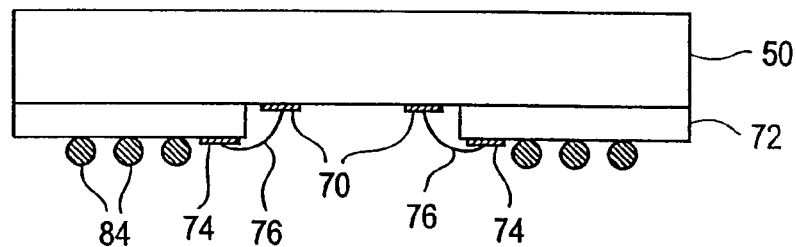
FIG. 12 illustrates a high density planar slave device system with a co-planar interconnect channel implemented with a thin film and bond balls, in accordance with an embodiment of the invention.

FIG. 12 illustrates an alternate embodiment of the invention. In particular, FIG. 12 illustrates a substrate 50 with device bond pads 70. An interconnect substrate 72, implemented as thin-film, flexible tape, or the like, is positioned on the substrate 50. A channel (not shown) is embedded in the interconnect substrate 72. The interconnect substrate 72 includes interconnect substrate bond pads 74. Bond wires 76 link the device bond pads 70 and the interconnect substrate bond pads 74. Further, the interconnect substrate 72 includes bond balls 84 for connection to a printed circuit board or other substrate. The embodiment of FIG. 12 represents a hybrid package including bond wires and flip-chip functionality. This embodiment underscores how the features of the invention can be implemented into a variety of packaging configurations, thereby providing an engineer with many design options.

Figure 13:
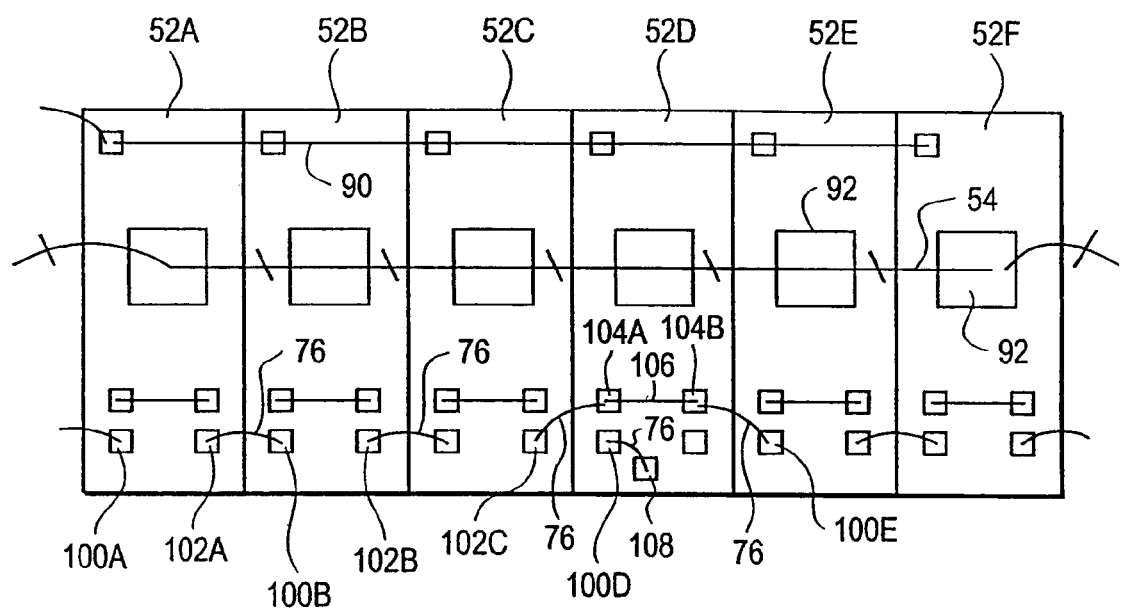
FIG. 13 illustrates a high density planar slave device system with a co-planar interconnect channel implemented to isolate individual non-functional slave devices.

FIG. 13 illustrates a technique of isolating a flawed slave device in a set of slave devices constructed in accordance with the invention. The figure shows a set of slave devices 52A-52F. Through standard testing of the slave devices it is determined that slave device 52D is flawed. Thus, it must be isolated from the remaining functional devices.

The circuit of FIG. 13 includes a reset line 90, which is connected to each slave device 52A-52F. The figure also illustrates an interconnect channel 54, linking each slave device via a set of bond pads. Element 92 on each slave device is a single large bond pad symbolizing a set of small bond pads or vias.

Each slave device 52A-52F includes a scan-in pad 100 and a scan out pad 102. Bond wires 76 are used to connect a scan out pad 102 to a scan in pad 100 of an adjacent device. For example, as shown in FIG. 13, a bond wire 76 is used to connect scan out pad 102A of slave device 52A to scan in pad 100B of slave device 52B.

In the case of a flawed slave device, such as slave device 52D in this example, a bond wire 76 is used to connect the scan in pad 100D to a ground pad 108. The slave device 52D is configured such that it is disabled when its scan in pad 100D is grounded. Notwithstanding the flawed and disabled slave device 52D, the remaining slave devices can operate by connecting a bond wire between the scan out pad 102C and the input bypass bond pad 104A. A lead 106 connects the input bypass bond pad 104A to the output bypass bond pad 104B. A bond wire 76 links the output bypass bond pad 104B to the scan in pad 100E of slave device 52E. This configuration accommodates a flaw in a slave device 52D in a set of set of slave devices 52A-52F.

Figure 14:
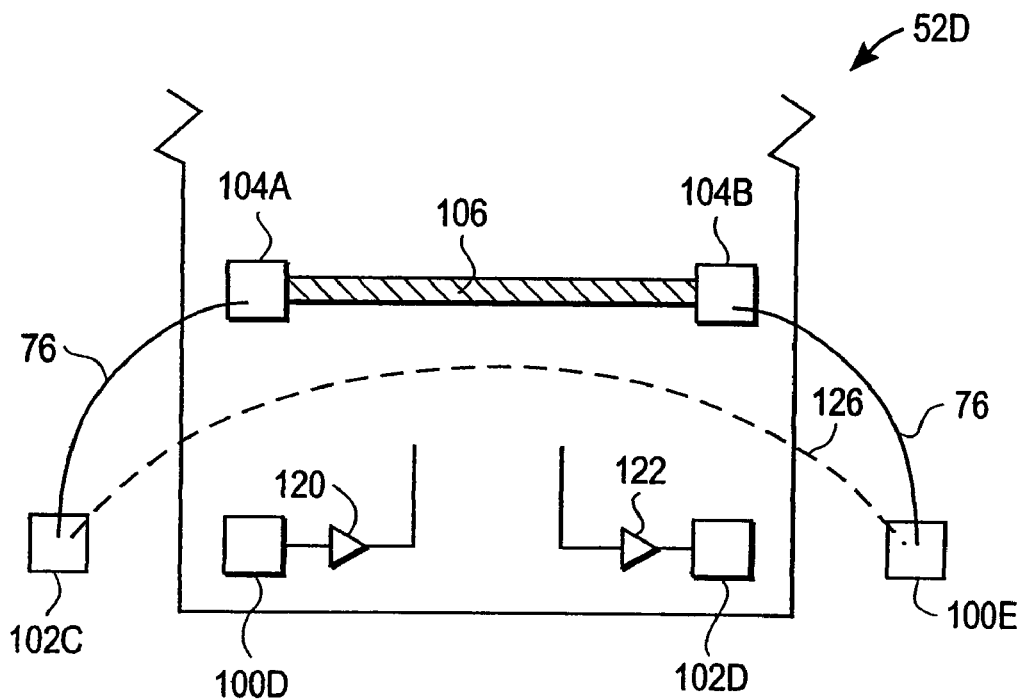
FIG. 14 is an enlarged view of a portion of the device of FIG. 13.

FIG. 14 is an enlarged view of a portion of the device of FIG. 13. In particular, FIG. 14 illustrates a portion of slave device 52D, including a scan in pad 100D and a scan out pad 102D. An input buffer 120 is preferably connected to the scan in pad 100D, while an output buffer 122 is preferably connected to the scan out pad 102D. The figure also shows a lead 106 connected between an input bypass bond pad 104A and an output bypass bond pad 104B. It is appreciable from FIG. 14 that the lead 106 is used to reduce the bond wire length when the device 52A is bypassed. In other words, in the absence of this lead 106, a relatively long bond wire would have to be used to span an inoperative device. By way of example, a relatively long bond wire 126 is shown in phantom in FIG. 14. Such a bond wire is relatively difficult to implement, is susceptible to damage, and creates a relatively high impedance. The present invention avoids this problem through the use of the bypass lead 106, which is accessed through relatively short bond wires 76. The short bond wire 76A is connected between a scan out pad 102C and the output bypass bond pad 104A, while the short bond wire 76B is connected between the output bypass bond pad 104B and the scan in pad 100E.

Figure 15:
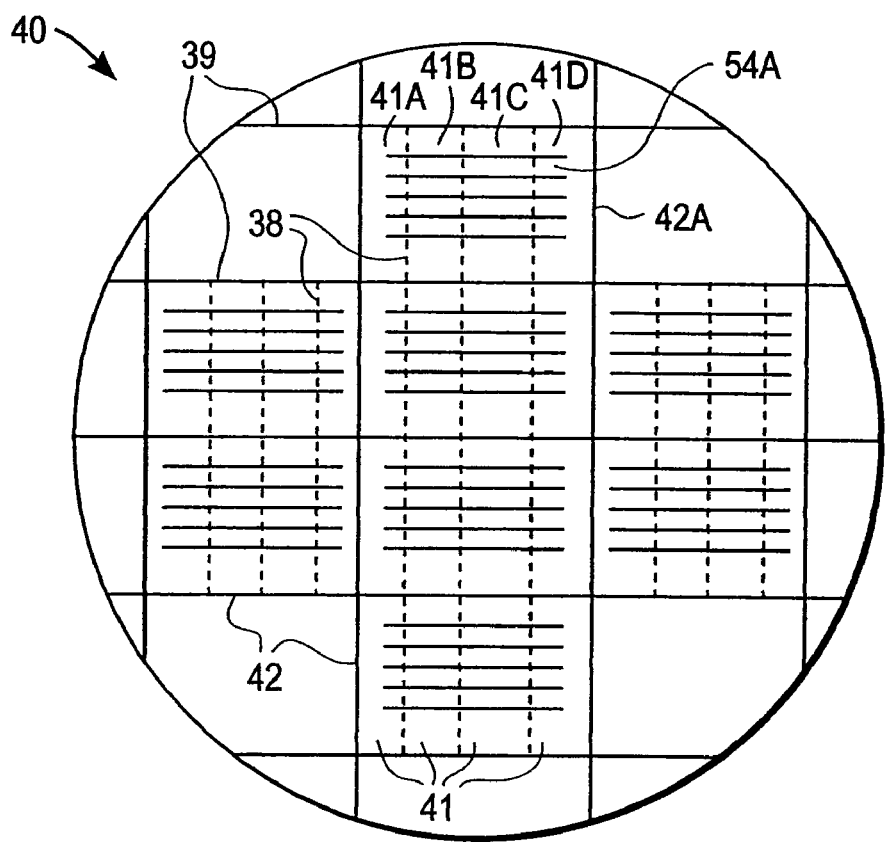
FIG. 15 illustrates a wafer with different sets of slave devices separated by scribe lines.

FIG. 15 illustrates a wafer 40 with different groups 42 of slave devices 41 separated by scribe lanes 39, which are shown as bold lines. Interior scribe lanes 38 also separate individual slave devices 41 within each group 42, as shown with dashed lines. The interior scribe lanes 38 are relatively narrow scribe lanes that will not be used for cutting the wafer 40. The interior scribe lanes 38 account for tolerance errors that occur during the step-and-repeat operation when masks are made. The interior scribe lanes 38 prevent adjacent die patterns from overlapping with each other.

An interconnect channel 54 connects individual slave devices 41 within a single group 42. Thus, for example, interconnect channel 54A connects individual slave devices 41A, 41B, 41C, and 41D of group 42A.

In the prior art, scribe lanes 39 are placed around each individual device 41. In contrast, with the present invention, standard scribe lanes 39 can be placed around a group 42 of devices 41, while relatively narrow interior scribe lanes 38 can be placed between devices 41 within a group, since the interior scribe lanes 38 will not be used for cutting.
Space must be allocated on the wafer 40 for the scribe lanes 39. Observe that with the present invention the amount of space reserved for scribe lanes 39 can be reduced. This reduction in scribe lane space results in more chips per wafer, thus reducing cost and improving production capacity.

Figure 16:
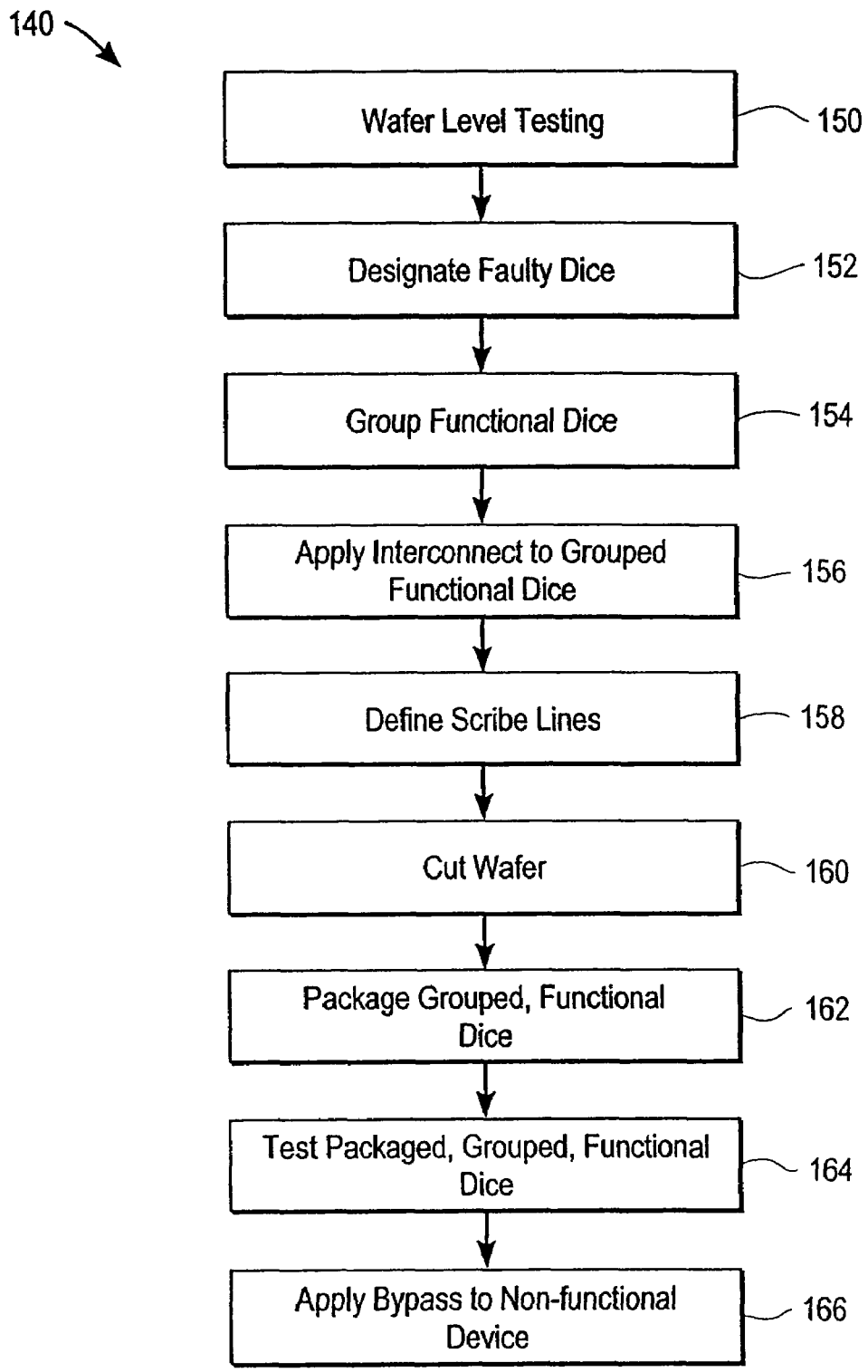
FIG. 16 illustrates processing steps for grouping, cutting, and packaging semiconductor systems in accordance with an embodiment of the invention.
Figure 17:
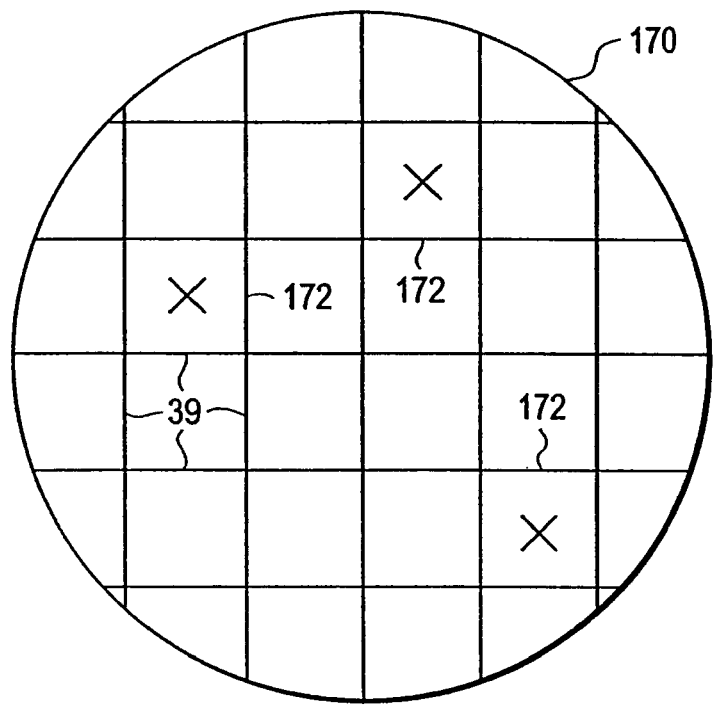
FIG. 17 illustrates a wafer with designated faulty dice identified in accordance with the process of FIG. 16.
Figure 18:
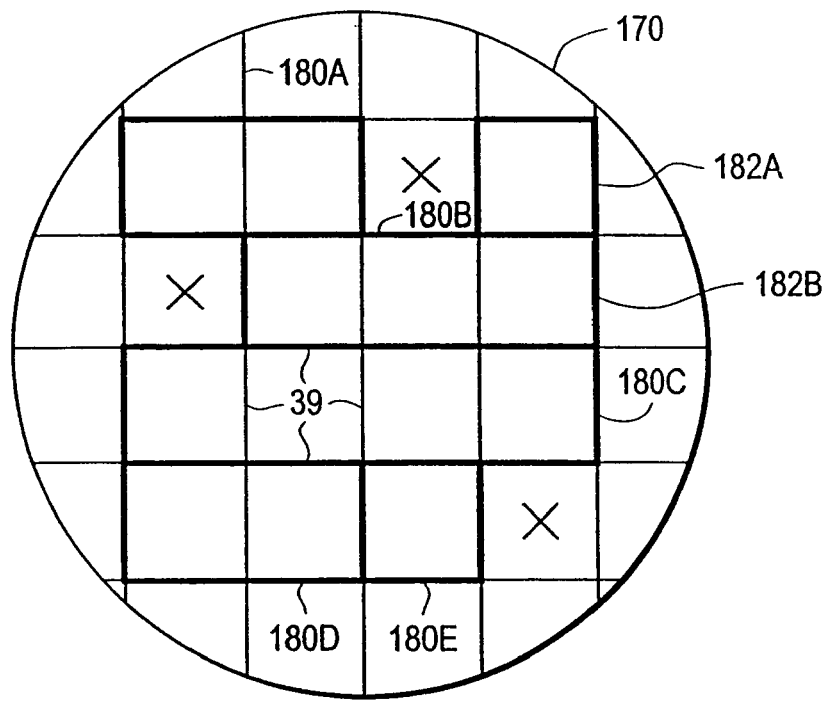
FIG. 18 illustrates a wafer with grouped, functional dice identified in accordance with the process of FIG. 16.

The novel structure of the invention facilitates new processes for testing, cutting, and packaging semiconductor devices. FIG. 16 illustrates a testing, cutting, and packaging process 140 utilized in accordance with an embodiment of the invention. The first step of the process 140 is to perform wafer level testing (step 150) of devices fabricated on the wafer. This step is performed in accordance with prior art techniques. The next processing step is to designate faulty dice (step 152). FIG. 17 illustrates a wafer 170 with designated faulty dice 172 identified in accordance with step 152. In accordance with prior art techniques, the wafer 170 would be cut to form individual dice at this point. In contrast, the present invention groups functional dice (step 154) at this point. The result of this process is shown in FIG. 18, which illustrates the wafer 170 including grouped functional dice 180A, 180B, 180C, and 180D. In the present example, this process results in individual dice 182A, 182B, and 182C.

Figure 19:
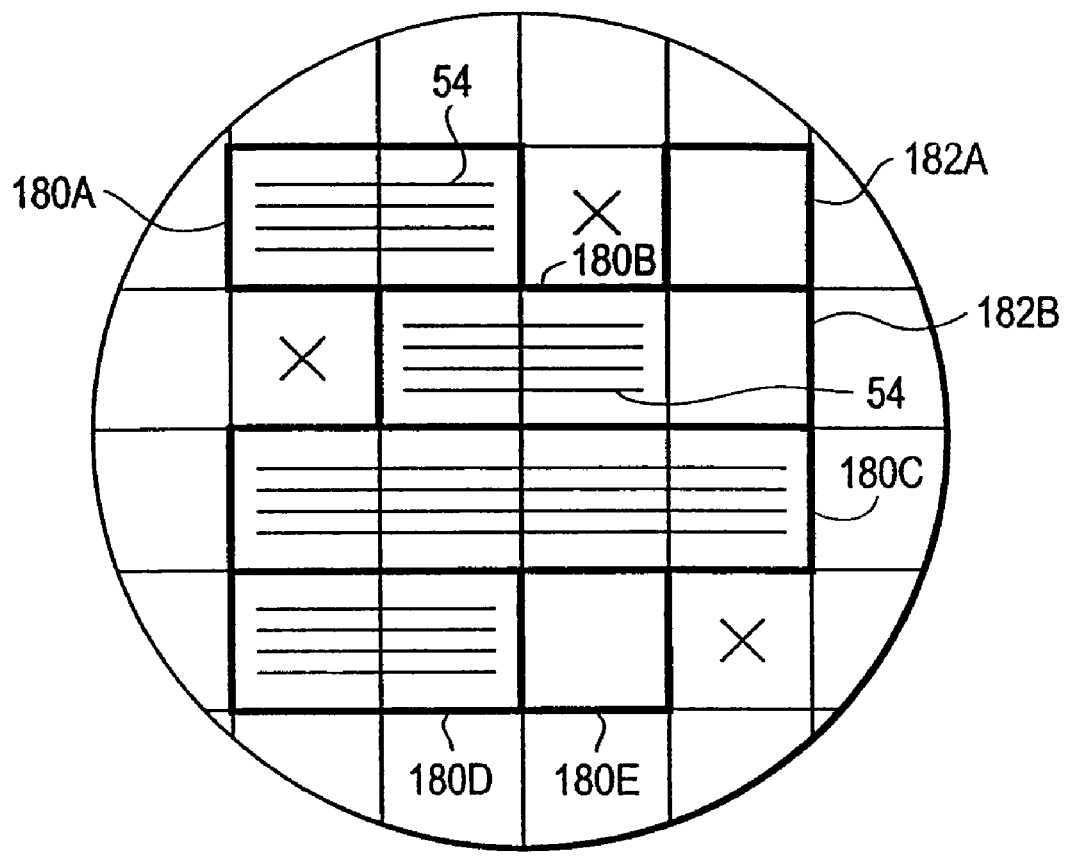
FIG. 19 illustrates a wafer with interconnect channels positioned on grouped, functional dice identified in accordance with the process of FIG. 16.

Interconnect is then applied to the grouped, functional dice (step 156). FIG. 19 illustrates interconnect 54 attached to the grouped, functional dice 180. At this point, scribe lines can be defined within scribe lanes that will be cut (step 158).

The next processing step shown in FIG. 16 is to cut the wafer (step 160). After the wafer is cut, grouped functional dice are packaged (step 162). Each packaged device is then tested (step 164). If an individual die is identified as non-functional at this point, a bypass is applied for the non-functional devices (step 166). This bypass operation is of the type described in connection with FIGS. 13-14. Observe that the bypass operation may be used to disable faulty devices identified during wafer level testing. Alternately, wafer level testing may be avoided altogether and faulty devices may be identified and isolated once they are in a package.

There are a number of inventive features associated with the process of FIG. 16. First, observe that the grouping of functional dice is not performed until after faulty dice are identified. This allows non-defective sub-circuits to be grouped according to locations of defective sub-circuits. Next, note that the interconnect is applied to selected devices after appropriate grouping. Further, the process of FIG. 16 flexibly defines scribe lines after the grouping of devices. The process of FIG. 16 further includes the step of exploiting a bypass feature for non-functional devices. This step is advantageously performed after the semiconductor is placed within its package.

Figure 20A:
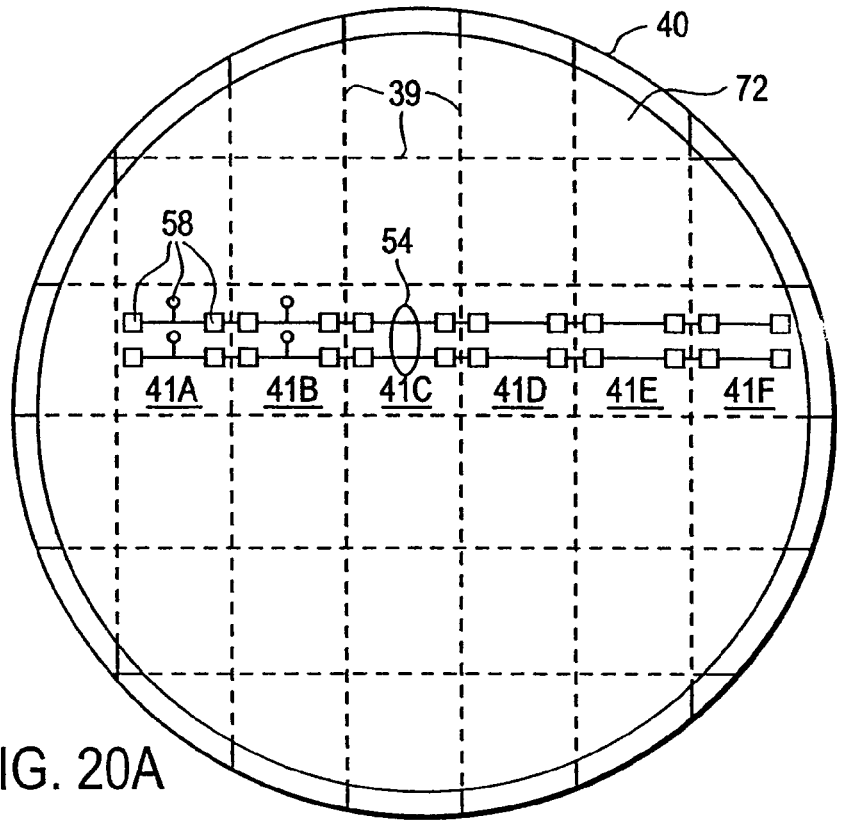
FIGS. 20A-20C illustrates the formation, from a wafer, of a set semiconductor systems with controlled impedance buses in accordance with an embodiment of the invention.
Figure 20B:
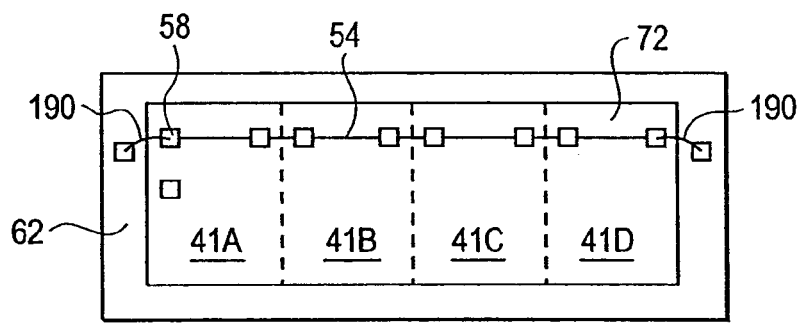
Figure 20C:
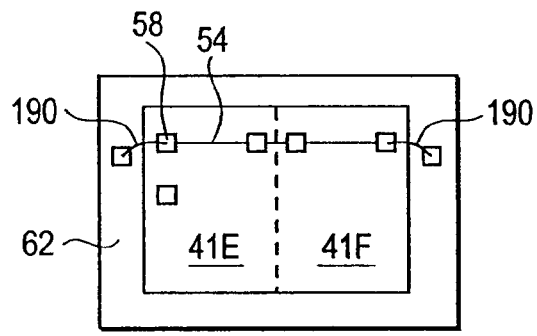

The advantages of the invention are more fully appreciated with reference to FIGS. 20A-20C. FIG. 20A illustrates a wafer 40 with a set of semiconductor devices 41A-41F formed thereon. Scribe lanes 39 separate individual semiconductor devices 41. An interconnect substrate 72 is positioned over the wafer 40 and supports the interconnect channel 54. Bond pads or vias 58 are used to establish electrical communication between the interconnect channel 54 and individual semiconductor devices 41.

FIG. 20B illustrates a set of semiconductor devices 41A-41D cut from the wafer 40. The figure also illustrates the interconnect channel 54 positioned on the interconnect substrate 72. In this embodiment, the semiconductor devices 41A-41D are positioned on a motherboard 62. Electrical connections are established between the interconnect channel 54 and the motherboard 62 via bond wires 190.

FIG. 20C illustrates a set of semiconductor devices 41E-41F cut from the wafer 40. The figure also illustrates the interconnect channel 54 positioned on the interconnect substrate 72. Once again, electrical connections are established between the interconnect channel 54 and the motherboard 62 via bond wires 190.

Figure 21:
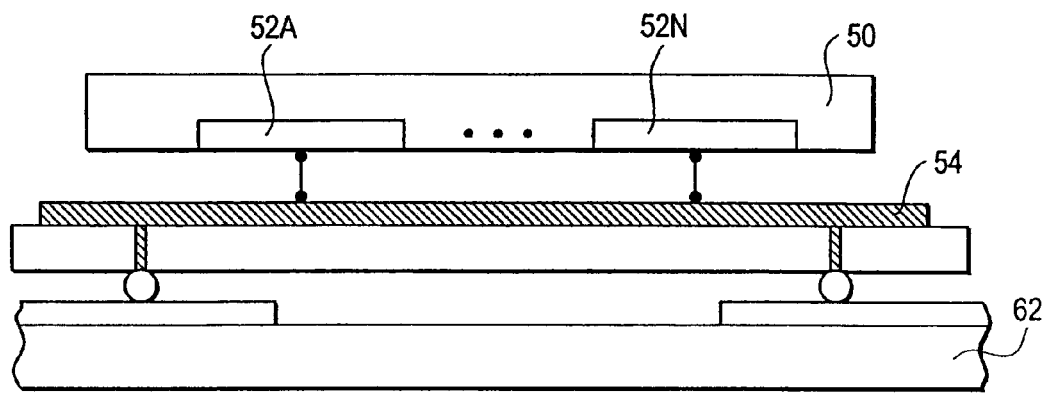
FIG. 21 is a cross-sectional view of an embodiment of the invention.

FIG. 21 is a cross-sectional view of a substrate 50 (e.g., a first substrate) with a set of slave devices 52A-52N embedded therein. The signals from the slave devices 52A-52N are routed to a second substrate 62 (e.g., a printed circuit board or a motherboard) via an interconnect channel 54 (e.g., a third substrate or interconnect substrate). Observe in FIG. 21 that the interconnect channel 54, for example in the form of a flexible tape, also operates to route signals between slave devices 52A-52N. Thus, the interconnect channel 54 operates as a multi-drop bus for a single substrate 50 having a set of slave devices 52A-52N.

Figure 22:
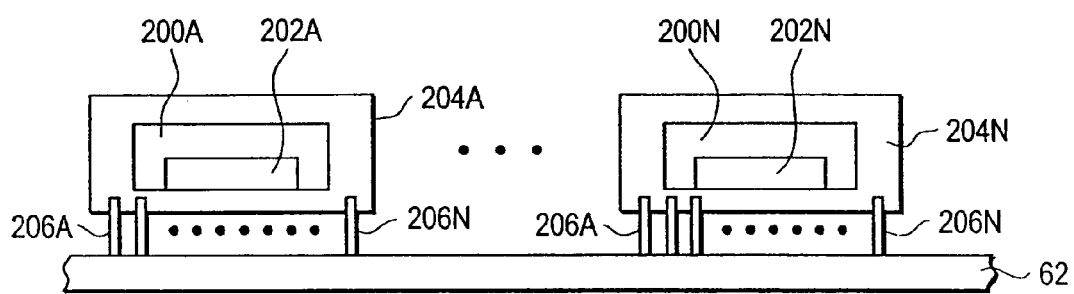
FIG. 22 is a cross-sectional view of a prior art system.

The configuration of FIG. 21 stands in sharp contrast to a prior art implementation shown in FIG. 22. FIG. 22 illustrates a substrate 200A with a single slave device 202A embedded therein. Signals from the slave device 202A are routed to the motherboard 62 via package pins 206A-206N of the package 204A enclosing the substrate 200A. The motherboard 62 must support multiple packages 204A-204N. Each package 204 requires its own set of package pins 206A-206N for signal routing. Observe that the structure of FIG. 22 requires signals between slave devices 202 (e.g., from 202A to 202N) to be routed over the motherboard 62. In contrast, with the system of FIG. 21, these slave-to-slave signals may be routed internally with the interconnect channel 54, thereby bypassing the motherboard 62. This allows for greater processing speeds. In addition, it can be readily appreciated that the configuration of FIG. 22 requires a large number of packages, whereas the system of FIG. 21 can utilize a single package for all of the slave devices 52A-52N formed within the substrate 50.

Those skilled in the art will appreciate that various combinations of the embodiments of FIGS. 4-13 may be used in accordance with the invention. That is, various techniques may be used to connect the interconnect structure to an external package or motherboard, and various techniques may be used to connect a package enclosing a set of slave devices to a motherboard or similar mounting structure.

Figure 1:
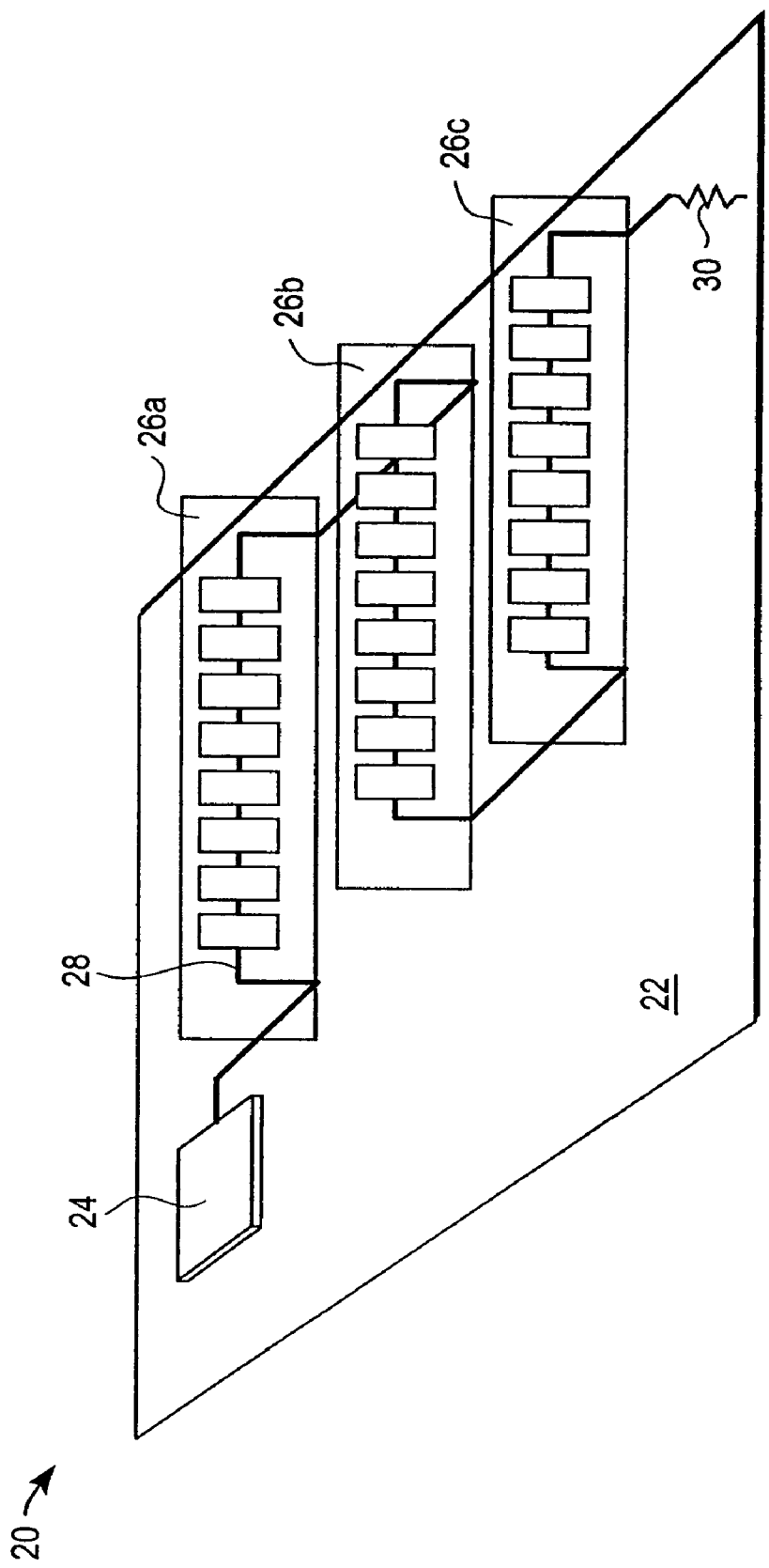
FIG. 1 illustrates a master-slave digital system constructed in accordance with the prior art.
Figure 2:
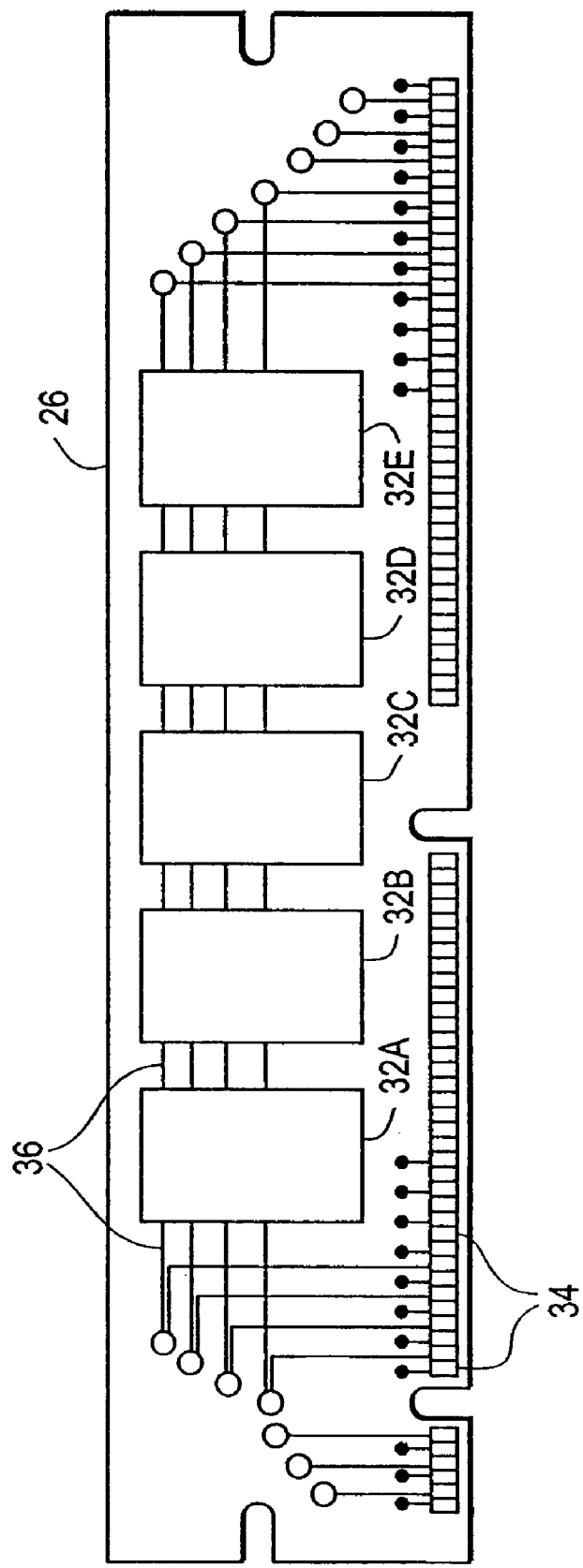
FIG. 2 illustrates a side view of a slave module from the master-slave digital system of FIG. 1.

In each embodiment of the invention, slave devices are combined to form a high density package. For example, the individually packaged slave devices 32A-32E of FIG. 2 can be substituted with a single package 90, in accordance with the invention.

Those skilled in the art will recognize a number of advantages associated with the invention. First, the invention produces high density systems. The high density systems reduce signal propagation time. In addition, the high density systems reduce packaging costs, since a number of devices are positioned in a single package, instead of each device having its own package. Further, the structure of the invention improves thermal performance, since a larger semiconductor substrate, which is highly thermally conductive, is available to spread heat.

The traces forming the interconnect channel can be extremely narrow. This facilitates high density routing. The invention also reduces the number of external inputs and outputs since many signals will only be routed internally between semiconductors.

The invention facilitates various design optimizations. For example, if five slave devices are each implemented as a memory with a small associated controller, in many cases a single controller can be used for a set of slave devices. This sharing of resources is efficient, and it also improves manufacturing yield since simplified slave devices are easier to fabricate.

Note that memory systems typically employ an even number of slave devices. Grouping an odd number of slave devices allows for redundancy in case one slave device is found to be defective during manufacturing and assembly.

The invention improves performance in master-slave systems, such as memory systems. The improved performance can be exploited to increase the information bandwidth of computers and computer subsystems.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram Corm in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, that thereby enable others skilled in the art to best utilize the invention and various embodiments with various modifications as are suited to the particular use contemplated. It is intended that the scope of the invention be defined by the following claims and their equivalents.

What is claimed is:

1. A semiconductor package comprising:
   a plurality of semiconductor devices each including: a first bypass pad and a second bypass pad interconnected by a bypass lead, and connection pads;
   the plurality of semiconductor devices including an inoperative device and a plurality of operational devices; and
   an electrical connector connecting the first bypass pad of the inoperative device to a respective connection pad of a first device of the plurality of operational devices.

2. The semiconductor package of claim 1, including an additional electrical connector connecting the second bypass pad of the inoperative device to a respective connection pad of a second device of the plurality of operational devices, wherein the first device and second device are interconnected by the first electrical connector, the bypass lead, and the second electrical connector.

3. The semiconductor package of claim 1, further comprising an electrical connector connecting a connection pad of the inoperative device to a power supply voltage node to disable operation of the inoperative device.

4. The semiconductor package of claim 1, wherein the plurality of semiconductor devices are disposed adjacent one another.

5. The semiconductor package of claim 1, wherein the plurality of semiconductor devices are disposed in the same plane.

6. The semiconductor package of claim 1, further comprising a plurality of electrical connectors coupling respective connection pads of adjacent operational devices.

7. A semiconductor package comprising:
   a plurality of semiconductor devices, each comprising a bypass lead and a plurality of connection pads;
   the plurality of semiconductor devices including a flawed device and a plurality of functional devices, including first and second functional devices disposed near to the flawed device;
   a plurality of electrical connections that electrically connect a respective connection pad of the first functional device to a respective connection pad of the second functional device via the bypass lead of the flawed device.

8. The semiconductor package of claim 7, further comprising an additional electrical connector connecting a connection pad of the flawed device to a power supply voltage node.

9. The semiconductor package of claim 8, wherein connecting the first connection pad of the flawed device to the power supply voltage node disables operation of the flawed device.

10. The semiconductor package of claim 7, wherein the flawed device is inoperative.

11. The semiconductor package of claim 7, wherein the plurality of semiconductor devices are disposed adjacent one another.

12. The semiconductor package of claim 7, wherein the plurality of semiconductor devices are disposed in the same plane.

13. A semiconductor package, comprising:
a plurality of semiconductor devices including an operative semiconductor device and an inoperative semiconductor device, wherein each of the plurality of semiconductor devices comprises: at least two bypass pads interconnected by a bypass lead, and a set of input/output pads; and
a plurality of electrical connections, each electrically coupling a respective one of the input/output pads on the operational semiconductor device to a respective bypass pad on the inoperative semiconductor device.

14. The semiconductor package of claim 13, further comprising at least one electrical connector that electrically connects a respective input/output pad of the operative semiconductor device to a respective input/output pad of an additional operative semiconductor device via the bypass lead of the inoperative semiconductor device.

15. The semiconductor package of claim 13, further comprising an electrical connector connecting a respective connection pad of the inoperative semiconductor device to a power supply voltage node so as to disable operation of the inoperative semiconductor device.

16. The semiconductor package of claim 13, further comprising an additional electrical connector connecting a connection pad of the inoperative semiconductor device to a power supply voltage node.

17. The semiconductor package of claim 16, wherein connecting the first connection pad of the flawed device to the power supply voltage node disables operation of the flawed device.

18. The semiconductor package of claim 13, wherein the plurality of semiconductor devices are disposed adjacent one another.

19. The semiconductor package of claim 13, wherein the plurality of semiconductor devices are disposed in the same plane.

20. The semiconductor package of claim 13, wherein each of the input/output pads are connected to a buffer.

* * * * *